Figure 1:
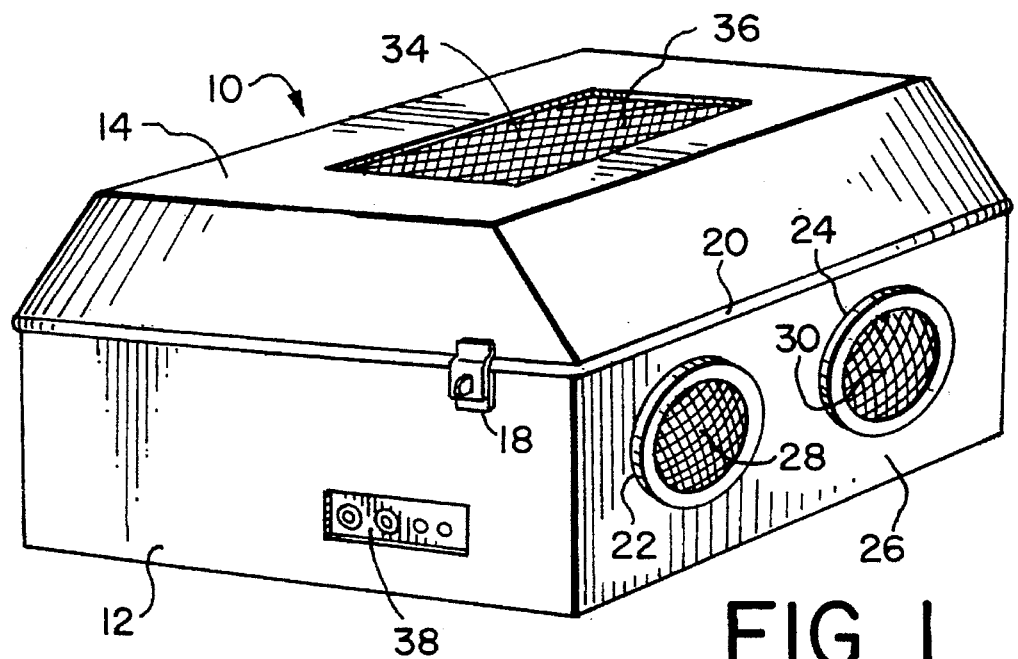

United States Patent [19]
Ramsey

[11] Patent Number: 5,594,200
[45] Date of Patent: Jan. 14, 1997

[54] ELECTROMAGNETIC ISOLATION CHAMBER

[75] Inventor: John G. Ramsey, Pittsford, N.Y.

[73] Assignee: Ramsey Electronics, Inc., Victor, N.Y.

[21] Appl. No.: 488,876

[22] Filed: Jun. 9, 1995

[51] Int. Cl.$^6$ ........................................... H05K 9/00
[52] U.S. Cl. ......................... 174/35 R; 174/35 MS
[58] Field of Search ..................... 174/35 R, 35 MS, 174/35 E, 35 GC, 50; 361/816, 818; 220/4.01, 4.02

[56] References Cited

U.S. PATENT DOCUMENTS

| | | | |
|---|---|---|---|
| 3,883,749 | 5/1975 | Whittaker et al. | 250/516 |
| 4,247,737 | 1/1981 | Johnson et al. | |
| 4,884,171 | 11/1989 | Maserang et al. | |
| 4,980,516 | 12/1990 | Nakagawa | 174/35 GC |
| 5,012,041 | 4/1991 | Sims et al. | |
| 5,017,419 | 5/1991 | Smith. | |
| 5,099,135 | 3/1992 | Gemmill | 250/516.1 |
| 5,136,119 | 8/1992 | Leyland. | |
| 5,171,936 | 12/1992 | Suzuki et al. | |
| 5,226,210 | 7/1993 | Koskenmaki et al. | 29/527.5 |
| 5,262,588 | 11/1993 | Gallagher | 174/345 R |
| 5,373,102 | 12/1994 | Ehrlich et al. | |

Primary Examiner—Bot L. Ledynh
Attorney, Agent, or Firm—M. Lukacher

[57] ABSTRACT

A glove box enclosing a volume shielded from electromagnetic radiation by the glove box wherein the gloves are formed from conductive material such as chain mail and are conductively and shieldingly attached around apertures in the walls of the glove box, permitting an operator to manipulate directly a device under test within the glove box while maintaining the shielding continuity of the box. A shielded window and an interior light can be included to facilitate viewing of a device within the box during manipulation of the device. The glove box provides an inexpensive, fully-shielded environment for the testing, tuning, adjusting, or repair of RF transmitting or receiving devices such as pagers, electronic notebooks, and cellular telephones.

13 Claims, 1 Drawing Sheet

5,594,200

ELECTROMAGNETIC ISOLATION CHAMBER

DESCRIPTION

The present invention relates to isolation chambers, particularly to chambers for isolating electromagnetic transmitting or receiving devices being tested, and more particularly to such a chamber comprising a fully-shielded glove box wherein a device being tested can be manipulated within the chamber by an operator outside the chamber through a wall of the chamber.

Electromagnetic reception and/or transmission is an important function of many devices, for example, portable pagers, cellular telephones, notebook computer modems, and the like. Testing, tuning, and repair of such a device can require that the device under test (DUT) be isolated from ambient electromagnetic radiation. This is sometimes necessary to permit exposing a receiving device to an unambiguous test signal free from electromagnetic interference, or to obtain a corresponding clean signal from a transmitting device. Typically, a device to be tested is placed inside an electromagnetic isolation (EMI) chamber, also known as a Faraday cage, comprising a continuous shielding enclosure which prevents ingress or egress of electromagnetic radiation. Such a chamber may take the form of an entire room, known in the art as a "screen room" for its continuous screen shielding, wherein an operator testing a device may also be enclosed in the room with the device. A screen room can be quite expensive and therefore may not be economically feasible for a small business.

Smaller shielded enclosures, also known as shielded boxes, capable of housing a DUT but not an operator, are disclosed, for example, in U.S. Pat. Nos. 4,884,171 to Maserang et al.; 5,136,119 to Leyland; and 5,171,936 to Suzuki et al. Shielded windows to permit viewing of the device under test may be provided and are disclosed, for example, in the '171 patent to Maserang et al. Shielded boxes are less expensive and less consumptive of space than are screen rooms, but a serious shortcoming of known shielded boxes is a lack of provision for direct tactile interaction or manipulation of the DUT by an operator during testing, measuring, or tuning. Known shielded boxes require that the device to be tested be placed in the box, the box then closed, and all communication with the device be done remotely. This prohibits, for example, an operator's making adjustments to a DUT or exercising a device directly through its normal modes of operation during testing and may require clumsy and time-consuming workarounds to do such exercising which may not be entirely representative of the device in actual use.

It is a principal object of the invention to provide an improved electromagnetic isolation chamber which allows direct manipulation of a device within the chamber by an operator outside the chamber.

It is a further object of the invention to provide an improved electromagnetic isolation chamber which permits lighting and viewing of a device under test within the chamber.

Briefly described, apparatus in accordance with the invention comprises a glove box enclosing a volume which is fully shielded from electromagnetic radiation for handling of devices requiring electromagnetic isolation for testing, tuning, repair, and the like. A shielded enclosure in accordance with the invention is a structure having continuous radio-frequency (RF) shielding on or embedded in all sides or walls of the structure so that substantially no net electromagnetic radiation is transmitted either into or out of the structure. The structure is capable of providing a signal reduction within the enclosure of about 80 db compared with the ambient signal strength outside the structure. The structure is openable, preferably by having a lid hinged from a body and securable by a latch, there being appropriately shielding gasketing between the lid and the body of the structure.

In a side or wall of the structure, preferably in the body, there is at least one opening to a shielded glove within the structure, the cuff of which glove is conductively attached to the shielding in the wall so that the glove itself is an RF barrier. The glove is formed from appropriately conductive material, preferably of metal chain mail. Preferably, two such openings and gloves are provided, for the left and right hands, respectively, of an operator. In another embodiment, a conductive sleeve of any desired shape, closed at its inner end, can be provided as required, for example, by the shape of some tool or instrument to be actively employed with a device under test.

Preferably, at least one shielded window is provided in a wall of the structure to permit observation of the device during testing, and a light can be provided within the enclosure. Shielded connectors can be provided as needed in one or more walls of the structure to permit connection of the DUT to, for example, an external power source or an external antenna.

Figure 2:
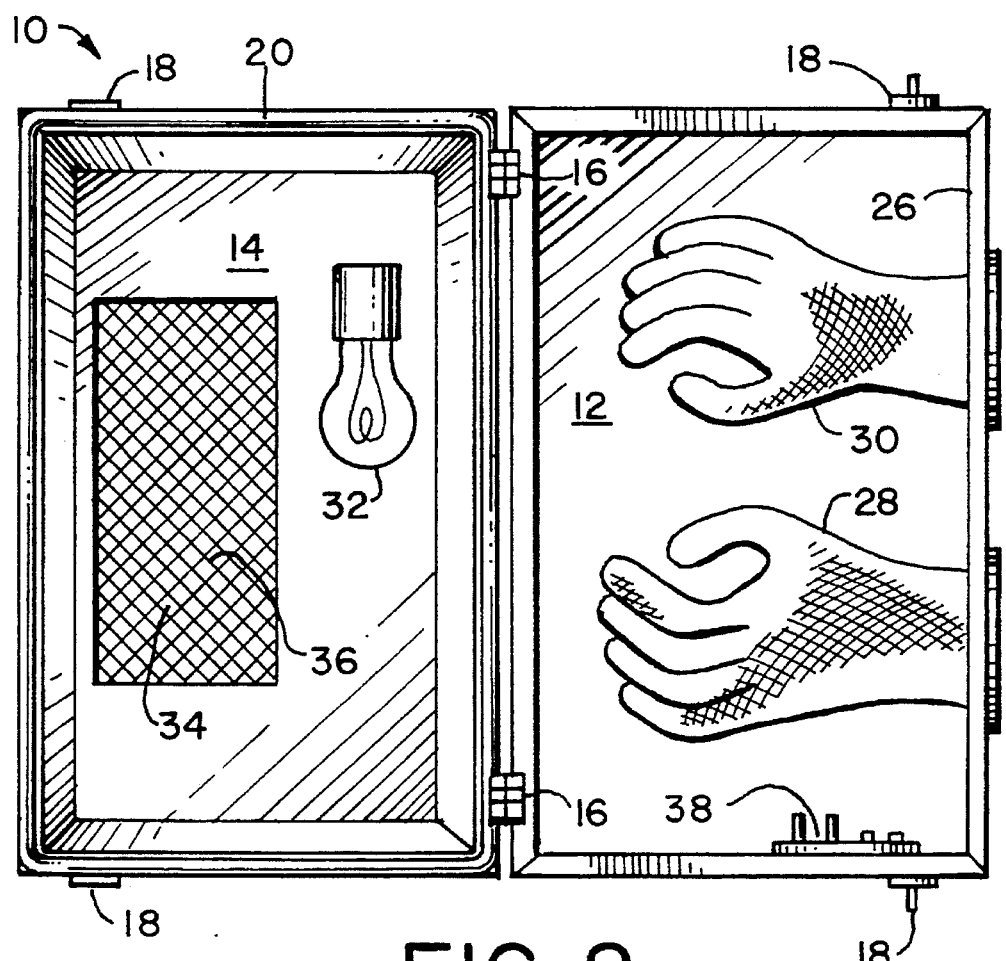

The foregoing and other objects, features, and advantages of the invention, as well as presently preferred embodiments thereof, will become more apparent from a reading of the following description in connection with the accompanying drawings in which:

FIG. 1 is an isometric view of an electromagnetic isolation chamber in accordance with the invention; and FIG. 2 is a plan view of the chamber of FIG. 1 showing the interior of the lid and the body of the chamber in the open position.

Referring to the figures, there is shown an electromagnetic isolation chamber 10 in the form of a substantially rectangular box having a base portion 12 and a top portion 14 which are hingably connected by hinges 16 to permit opening of chamber 10 to admit, for example, a device to be tested. Latches 18 secure the top to the base when the chamber is in the closed position to contain a volume of space electromagnetically isolated from the environment surrounding chamber 10. Both top 14 and base 12 are made of conductive material, for example, sheet metal, metal foil, metalized plastic, metal-plastic laminate, or metal screening having openings smaller than a fractional wavelength of the radiation to be shielded. The top and base are conductively connected, preferably through hinges 16, and preferably the juncture of the top and base in the closed position is provided with a shielding gasket 20 known in the art.

Apertures 22 and 24 are provided through wall 26 of base 12. Disposed within chamber 10 are two gloves 28 and 30 which are themselves conductive and can provide an RF barrier. Alternatively, either or both of the gloves can take the more general form of a sleeve closed at the inner end and adapted to enclose any desired non-shielded shape within the shielded environment within the chamber. The cuffs of gloves 28 and 30 are attached to the shielding in wall 26 around the periphery of apertures 22 and 24, respectively, as by soldering, welding, or clamping so that the electromagnetic shielding of wall 26 is not compromised by apertures 22 and 24. These gloves allow an operator direct access to a device under test without breaking the electromagnetic seal of the enclosure. Preferably, the gloves are formed from metal and are highly flexible, as when made from mesh, chain mail, or the like. Gloves made from other conductive materials may also be suitable. Chain mail-type gloves are known in the meat-cutting art where they are used to provide protection against accidental slicing or chopping injury to the hands of butchers, but their use as RF barriers in conjunction with an EMI box has not heretofore been disclosed. When very fine chain mail is used, a high level of sensitivity and manipulability can be imparted to the hands of an operator working with a device within the enclosure, while maintaining a high degree of electromagnetic shielding. Alternatively or in addition to the conductive gloves, and conductively connected around an aperture as are the gloves, a flexible, conductive shielding of any desired size and shape can be provided for admitting, for example, a tool or an analytical device to the interior of the chamber without defeating the electromagnetic isolation. Indeed, if desired, one or more entire sides of top or base or both of the chamber can be formed of loose-fitting chain mail to permit manual manipulation or actuation of a DUT without necessarily resorting to actual gloves.

To facilitate an operator's working with and viewing a device under test within chamber 10, top portion 14 is provided with a light 32 within the chamber and a shielded window 34. Window 34 can comprise, for example, metal screening 36 with openings about 0.1 inch on a side laminated between two sheets of clear acrylic glazing, the screening being conductively attached to top portion 14 around the periphery of the window as by a conductive bezel. Alternative means for providing shielding to the window are, for example, metal mesh, perforated metal sheet, and transparent conductive coatings. Suitable windows having shielding means are disclosed, for example, in U.S. Pat. Nos. 4,247,734 to Johnson et al.; 4,884,171 to Maserang et al.; 5,012,041 to Sims et al.; 5,017,419 to Smith; and 5,373,102 to Ehrlich et al.

A shielded connector 38 is provided in a wall of base 12, whereby an external antenna (not shown) can be connected to the DUT if desired for transmitting test signals to the DUT to test its sensitivity and/or for picking up DUT transmissions. A similar shielded connector can be provided if desired to connect a DUT to an external source of power during test.

From the foregoing description it will be apparent that there has been provided improved electromagnetic isolation chamber, wherein a device under test can be manipulated directly while being tuned, aligned, analyzed, or the like without compromising the shielding of the chamber. Variations and modifications of the herein described isolation chamber, in accordance with the invention, will undoubtedly suggest themselves to those skilled in this art. Accordingly, the foregoing description should be taken as illustrative and not in a limiting sense.

What is claimed is:

1. An electromagnetic isolation chamber containing a volume of space electromagnetically isolated from the surrounding environment, comprising:
    a) a wall enclosing said volume, said wall having first electromagnetic shielding surrounding said volume and having an aperture therethrough wherein said first shielding is disrupted; and
    b) a flexible, conductive second electromagnetic shielding disposed within said chamber and covering said aperture in said wall and being conductively and shieldingly attached to said first electromagnetic shielding of said wall around the periphery of said aperture, said second shielding being deformable and of sufficient size to enclose objects which may be inserted into said chamber through said aperture and to permit tactile feel and manipulation of said objects within said chamber, so that continuity of electromagnetic isolation of said volume is maintained through said insertion.

2. A chamber in accordance with claim 1 wherein said second electromagnetic shielding is formed of metal.

3. A chamber in accordance with claim 1 wherein said second electromagnetic shielding is chain mail.

4. A chamber in accordance with claim 1 wherein said second shielding is in the shape of a glove.

5. A chamber in accordance with claim 1 wherein said wall comprises a plurality of sides defining a box.

6. A chamber in accordance with claim 5 wherein said box is openable and has a top portion and a base portion.

7. A chamber in accordance with claim 6 wherein said top portion is conductively attached to said base portion.

8. A chamber in accordance with claim 7 wherein said top portion is attached by an attachment which comprises a hinge and a latch.

9. A chamber in accordance with claim 6 further comprising a shielding gasket between said top portion and said base portion.

10. A chamber in accordance with claim 1 further comprising a plurality of apertures in said wall, each of said apertures having a flexible, conductive shielding attached to said first electromagnetic shielding around the periphery of said aperture.

11. A chamber in accordance with claim 1 further comprising a shielded window in said wall.

12. A chamber in accordance with claim 11 wherein said shielding is selected from a list including metal mesh, metal screen, perforated metal sheet, and conductive coating.

13. A chamber in accordance with claim 1 further comprising a light within said chamber.

* * * * *